US008322963B2

(12) United States Patent
Hudgens et al.

(10) Patent No.: US 8,322,963 B2
(45) Date of Patent: Dec. 4, 2012

(54) END EFFECTOR FOR A CLUSTER TOOL

(75) Inventors: Jeffrey C. Hudgens, San Francisco, CA (US); Jagan Rangarajan, San Jose, CA (US); Michael R. Rice, Pleasanton, CA (US); Penchala N. Kankanala, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 280 days.

(21) Appl. No.: 12/422,867

(22) Filed: Apr. 13, 2009

(65) Prior Publication Data

US 2009/0263215 A1 Oct. 22, 2009

Related U.S. Application Data

(60) Provisional application No. 61/046,375, filed on Apr. 18, 2008.

(51) Int. Cl.
*B65H 5/00* (2006.01)

(52) U.S. Cl. .............. 414/226.01; 414/222.01; 414/806; 901/30; 901/15; 74/490.01

(58) Field of Classification Search .............. 414/222.01, 414/222.09, 225.01, 226.01, 806, 744.5; 294/64.1, 64.3; 901/30, 15; 74/490.01
See application file for complete search history.

(56) References Cited

U.S. PATENT DOCUMENTS

| 3,451,224 | A | * | 6/1969 | Colechia et al. | ............... | 405/190 |
| 3,888,362 | A | * | 6/1975 | Fletcher et al. | ............... | 414/620 |
| 4,416,577 | A | * | 11/1983 | Inaba et al. | ............... | 414/225.01 |
| 4,974,520 | A | * | 12/1990 | Dehne | ............... | 105/148 |
| 5,236,295 | A | * | 8/1993 | Ishii et al. | ............... | 414/222.07 |
| 2005/0217053 | A1 | * | 10/2005 | Kim et al. | ............... | 15/250.21 |
| 2008/0023293 | A1 | * | 1/2008 | Uratani et al. | ............... | 198/346.2 |

FOREIGN PATENT DOCUMENTS

| JP | 2004090186 | * | 3/2004 |
| WO | WO 2006/130910 | | 12/2006 |
| WO | WO 2007/059551 | | 5/2007 |

* cited by examiner

*Primary Examiner* — Donald Underwood
(74) *Attorney, Agent, or Firm* — Patterson & Sheridan, LLP

(57) ABSTRACT

Embodiments of the present invention generally provide an apparatus and method for transferring substrates in a processing system (e.g., a cluster tool) that has an increased system throughput, increased system reliability, improved device yield performance, a more repeatable wafer processing history (or wafer history), and a reduced footprint when compared to conventional techniques.

10 Claims, 16 Drawing Sheets

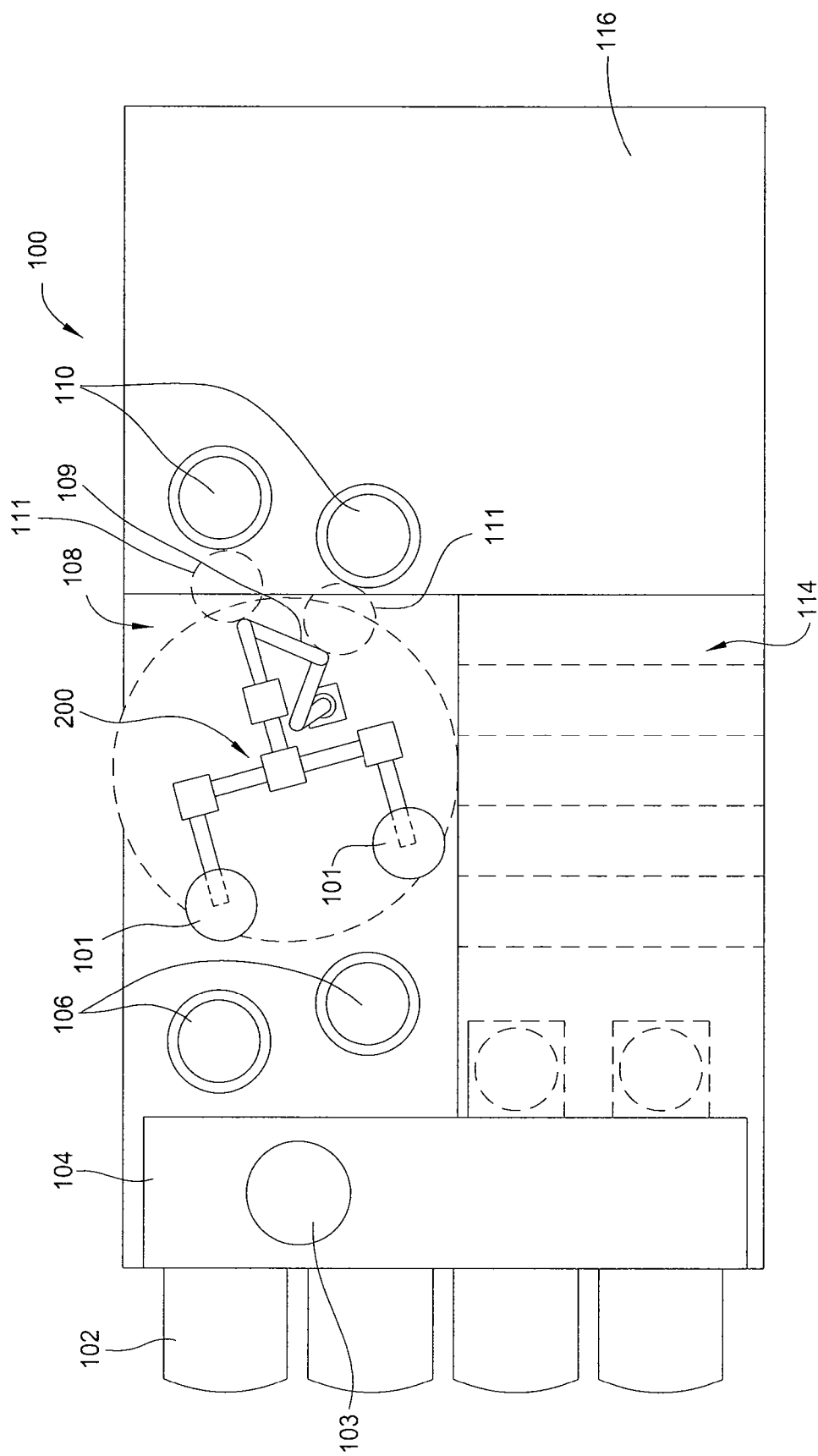

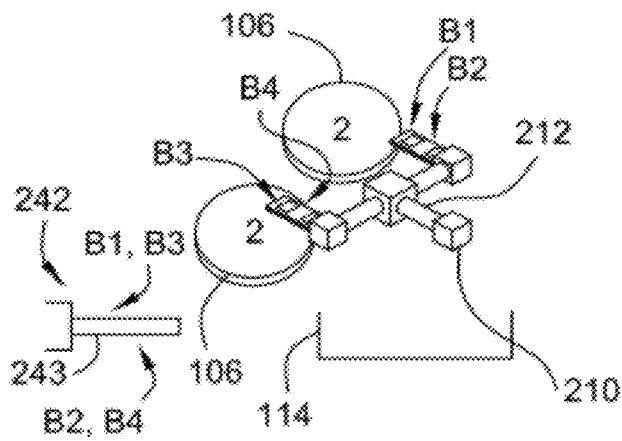
FIG. 4A1    FIG. 4A
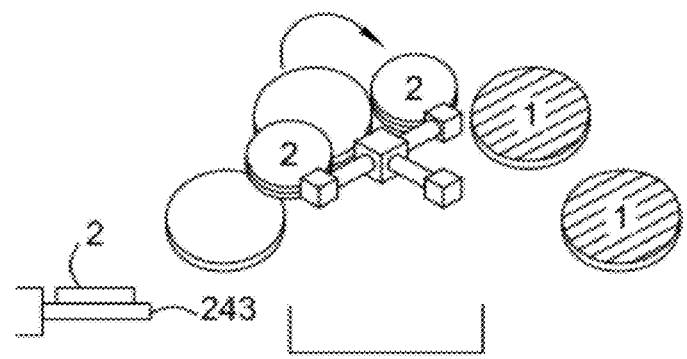
FIG. 4B1    FIG. 4B
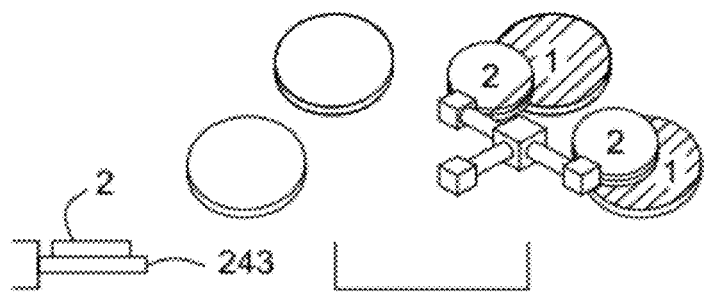
FIG. 4C1    FIG. 4C

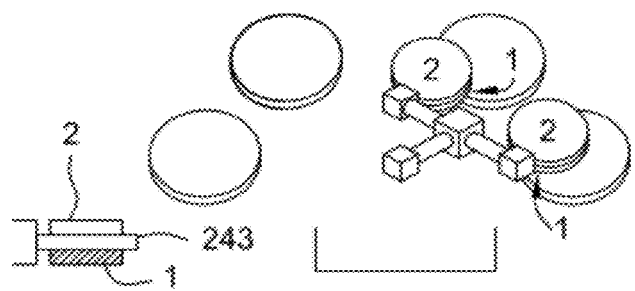
FIG. 4D1    FIG. 4D
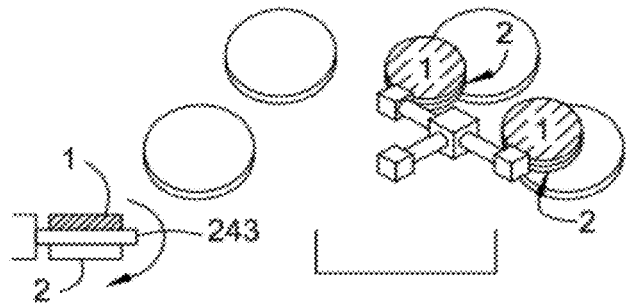
FIG. 4E1    FIG. 4E
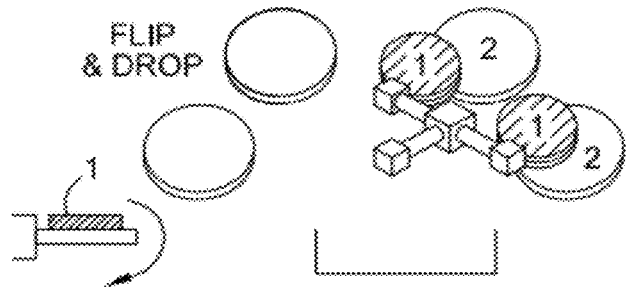
FIG. 4F1    FIG. 4F
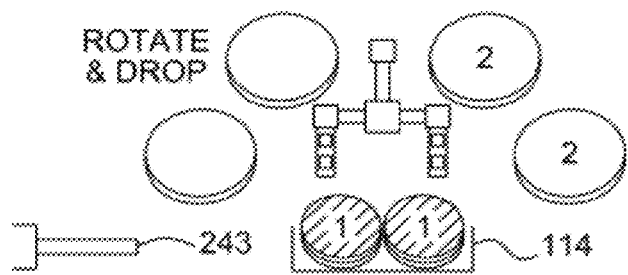
FIG. 4G1    FIG. 4G

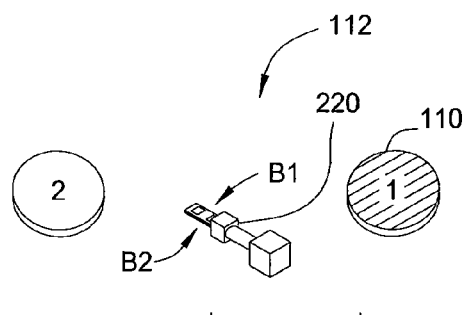
FIG. 6A
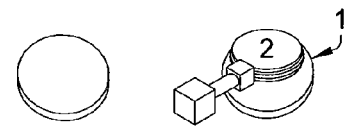
FIG. 6D
FIG. 6E
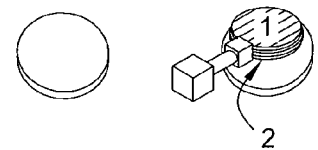
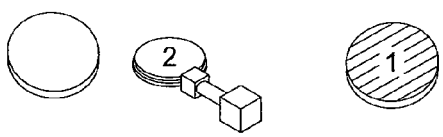
FIG. 6B
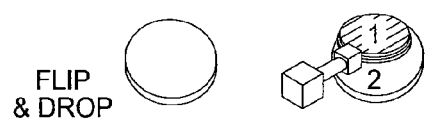
FIG. 6F
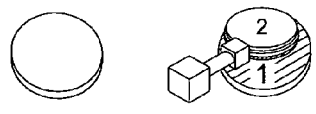
FIG. 6C
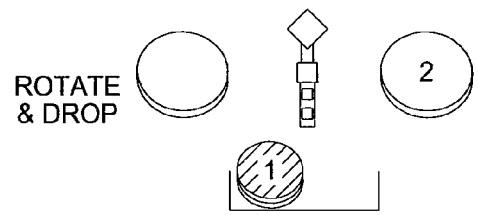
FIG. 6G

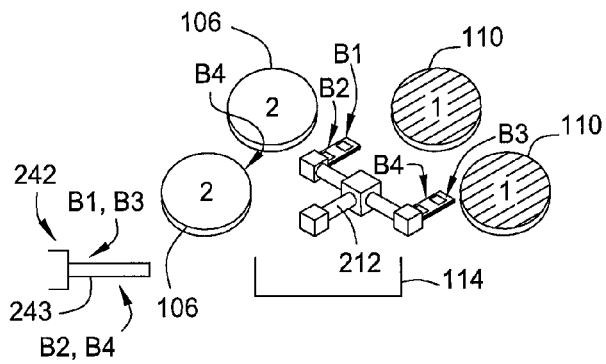
FIG. 9A1    FIG. 9A
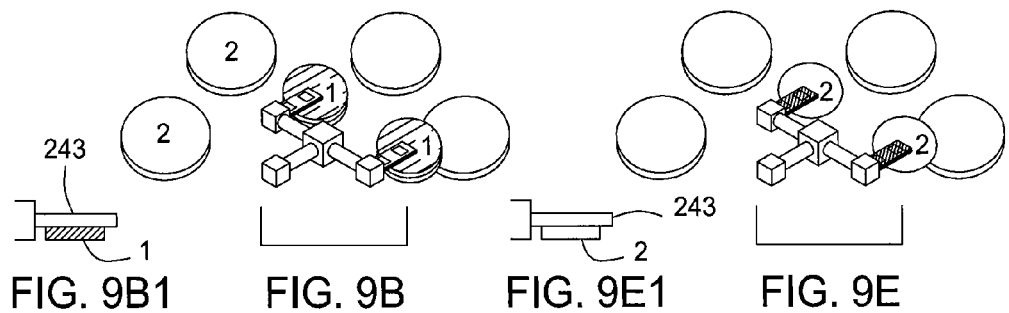
FIG. 9B1    FIG. 9B    FIG. 9E1    FIG. 9E
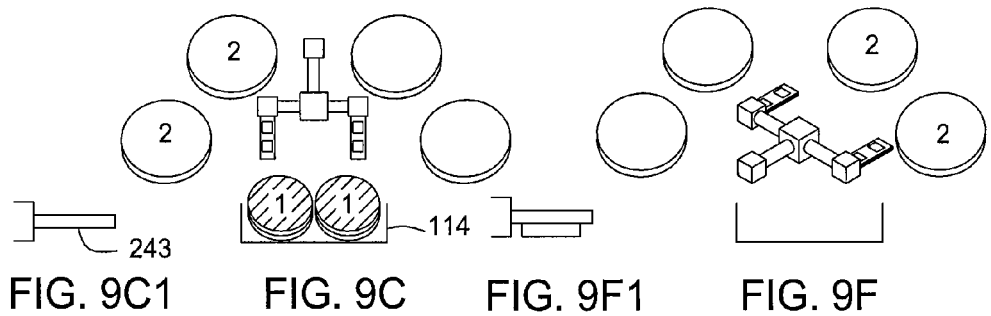
FIG. 9C1    FIG. 9C    FIG. 9F1    FIG. 9F
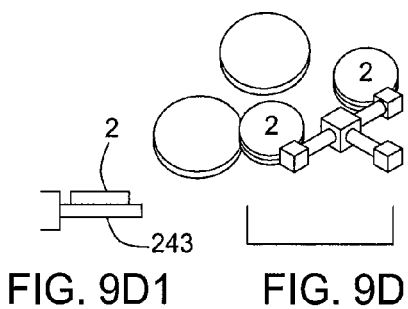
FIG. 9D1    FIG. 9D

END EFFECTOR FOR A CLUSTER TOOL

CROSS REFERENCE TO RELATED APPLICATIONS

This application claims benefit of U.S. provisional patent application Ser. No. 61/046,375, filed Apr. 18, 2008. Each of the aforementioned related patent applications is herein incorporated by reference in its entirety.

BACKGROUND OF THE INVENTION

1. Field of the Invention

Embodiments of the invention generally relate to a method and apparatus for transferring substrates. Some embodiments relate to a method and apparatus for transferring substrates using a robotic device that is capable of transferring multiple substrates in parallel.

2. Description of the Related Art

The process of forming electronic devices is commonly done in a multi-chamber processing system (e.g., a cluster tool) that has the capability to sequentially process substrates, (e.g., semiconductor wafers) in a controlled processing environment. Typical cluster tools will include a mainframe that houses at least one substrate transfer robots that transport substrates between a pod/cassette mounting device and multiple processing chambers that are connected to the mainframe. Cluster tools are often used so that substrates can be processed in a repeatable way in a controlled processing environment, and have application in many different industries, such as semiconductor processing which may include lithography, chemical mechanical polishing, wet/clean, deposition and etch processes. A controlled processing environment has many benefits which include minimizing contamination of the substrate surfaces during transfer and during completion of the various substrate processing steps. Processing in a controlled environment thus reduces the number of generated defects and improves device yield.

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence. A process sequence, as used herein, is generally defined as the sequence of device fabrication steps, or process recipe steps, completed in one or more processing chambers in the cluster tool. A process sequence may typically contain various substrate (or wafer) electronic device fabrication processing steps. In an effort to reduce CoO, electronic device manufacturers often spend a large amount of time trying to optimize the process sequence and chamber processing time to achieve the greatest substrate throughput possible given the cluster tool architecture limitations and the chamber processing times.

In some substrate processing sequences, due to short chamber processing times and the number of processing steps in the sequence, a significant portion of the time it takes to complete the processing sequence is taken up transferring the substrates between the various processing chambers. These type of substrate processing sequences are often known as robot limited processes. If the substrate throughput in a cluster tool is not robot limited, the longest process recipe step will generally limit the throughput of the processing sequence. Typical system throughput for the conventional semiconductor fabrication processes, such as a track lithography processes, will generally be between 100-120 substrates per hour, and be robot limited due to the short processing times and large number of processing steps.

Other important factors in the CoO calculation are the system reliability and system uptime. These factors are very important to a cluster tool's profitability and/or usefulness, since the longer the system is unable to process substrates, the more money is lost by the user due to the opportunity cost. Therefore, cluster tool users and manufacturers spend a large amount of time trying to develop reliable processes, reliable hardware and reliable systems that have increased uptime.

The push in the industry to shrink the size of semiconductor devices to improve device processing speed and to reduce the resulting generation of heat by the device, has reduced the industry's tolerance for process variability. To minimize process variability an important factor in some processing sequences is the issue of assuring that every substrate run through a cluster tool has the same "wafer history." A substrate's wafer history is generally monitored and controlled by process engineers to assure that all of the device fabrication processing variables that may later affect a device's performance are controlled, so that all substrates in the same batch are always processed the same way. To assure that each substrate has the same "wafer history" requires that each substrate experiences the same repeatable substrate processing steps (e.g., consistent coating process, consistent hard bake process, consistent chill process, etc.) and the timing between the various processing steps is the same for each substrate. Lithography-type device fabrication processes can be especially sensitive to variations in process recipe variables and the timing between the recipe steps, which directly affects process variability and ultimately device performance.

Therefore, there is a need for a system, a method and an apparatus that can process a substrate that meets desired performance goals with increased system throughput and thus reduced process sequence CoO.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 is a view of a cluster tool according to an embodiment of the invention;

FIGS. 4A-4G illustrate a dual twin processing sequence in a cluster tool according to embodiments of the invention.

FIGS. 4A1-4G1 illustrate the position of one or more substrates positioned on one of the blades in the end effector shown in FIGS. 4A-4G, respectively, according to an embodiment of the invention.

FIGS. 6A-6G illustrate a single dual transferring sequence in a cluster tool according to embodiments of the invention.

FIGS. 9A-9F illustrate the position of an end effector at various phases of the single twin transferring sequence illustrated in FIG. 8 according to embodiments of the invention.

FIGS. 9A1-9F1 illustrate the position of a substrate positioned on one of the blades in the end effector shown in FIGS. 9A-9F, respectively, according to an embodiment of the invention.

DETAILED DESCRIPTION

Figure 2A:
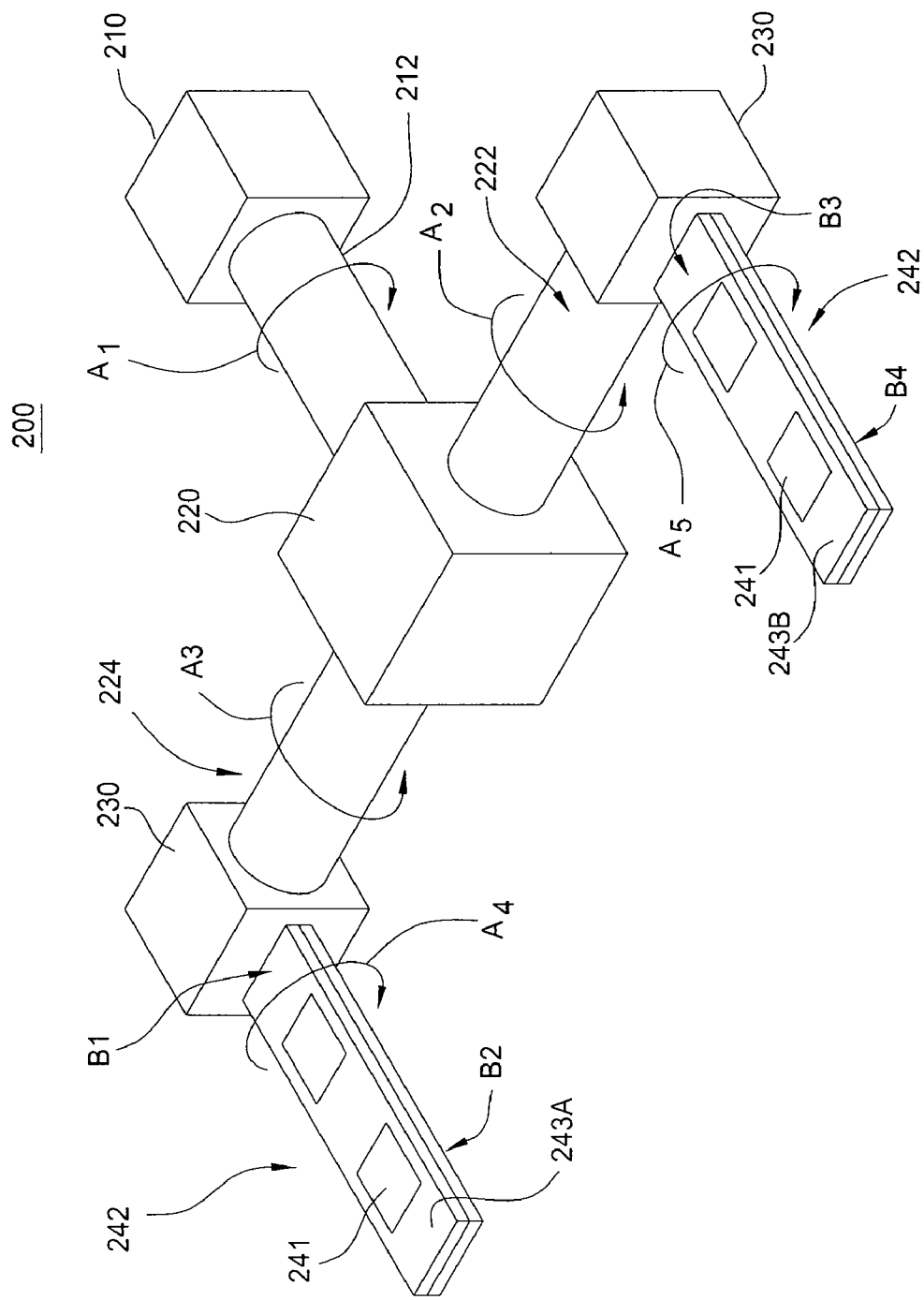
FIGS. 2A-2F are views of an end effector according to an embodiment of the invention.

Embodiments of the present invention generally provide an apparatus and method for transferring substrates in a multi-chamber processing system (e.g., a cluster tool) that has an increased system throughput, increased system reliability, improved device yield performance, a more repeatable wafer processing history (or wafer history), and a reduced footprint when compared to conventional techniques.

Although a cluster tool is described below, the methods and apparatus described herein may be employed in any application benefiting from increased system throughput where objects are manipulated by an end effector in order to process the objects.

Cluster Tool Configuration

FIG. 1 illustrates an example chemical mechanical polishing system 100 that utilizes a robotic device, such as robot assembly 108, to transfer substrates (i.e., processes substrates 101) from the pass through positions 106 to a chemical mechanical polishing (CMP) tool 116, and then to a cleaner 114. The cleaner 114 is generally used to clean the "dirty" substrates that have been processed in the CMP tool 116. A Factory Interface (FI) 104 may be positioned between the cassette positions 102 and the pass through positions 106 and may contain an FI robot 103 that is used to transfer the substrates 101 to and from the cassette positions 102. The CMP tool 116 may be disposed near the pass through positions 106. A robot assembly 108 may be positioned between the CMP tool 116 and the pass through positions 106 to transfer clean substrates there between. The CMP tool 116 is generally configured to polish the substrates received from the cassette positions 102. The end effector 200 may be moved by the robot arm 109 to transfer substrates within the CMP tool 116. The robot assembly 108 may comprise an end effector 200 and a robot arm 109. An example end effector 200 is described in more detail below. Load cups 110 of the CMP tool 116 may temporarily store the substrates 101. In one embodiment, buffer stations 111 may be placed in between the load cups 110 and pass through positions 106 to receive and hold substrates so that throughput variations in the substrate transfer limiting process steps (e.g., CMP process chamber throughput, clean chamber throughput) will minimally affect the throughput of substrates through the CMP tool 116.

In general, the CMP polishing process involves holding a substrate against a polishing pad under controlled pressure, temperature and rotational speed (velocity) in the presence of a chemical slurry or other fluid medium. In the discussion below, substrates will be referred to as "clean" before they are polished, and will be referred to as "dirty" substrates after they are polished. Control logic, such as processor logic within a computer, may control the operation of the robot assembly 108 and other system components.

FIG. 2A illustrates an end effector 200 according to one embodiment of the present invention. For some embodiments, the end effector 200 may be movably connected to a robot arm 109 that may be part of a cluster tool such as the robot assembly 108 of FIG. 1. In one embodiment, a first base member 210 (FIG. 2A) in the end effector 200 is connected to a last link or arm contained in the robot arm 109, such as a conventional SCARA (Selective Compliant Articulated Robot Arm) robot, 6-axis robotic device, or similar robotic device, so that the end effector 200 can be positioned in X, Y and/or Z directions by commands sent to the robot arm 109 by a computer or a controller. The end effector 200 may be used to position substrates in and transfer substrates between various chambers in a CMP transferring process.

In one embodiment, the end effector 200 may be connected to a robot arm 109 (not shown in FIG. 2A) through a first base member 210, which is connected to a second base member 220 through an effector arm 212. In general, the end effector 200 may contain a first base member 210, a second base member 220, and arm member 230, and a blade assembly 242. The second base member 220 may be movably connected to one or more arm members 230 through lateral effector arms 222, 224. These arm members 230 may be movably connected to one or more blades assemblies 242, which may contain one or more blades 243. Each blade 243, such as blades 243A and 243B shown in FIG. 2A, may have two substrate supporting sides B1, B2, B3, and B4. In some embodiments, a blade 243 may be a (metallic) surface used to support and/or retain a substrate. In some embodiments, the blade(s) 243 may have sensors 241 detecting the position of the substrate with respect to the blade(s) as the end effector 200 is positioned. The blade(s) may comprise various means to retain the substrate, such as a suction mechanism or edge gripping members. An example of an exemplary edge gripping member is further described in the commonly assigned U.S. patent application Ser. No. 11/315,873, filed Dec. 22, 2007, which is incorporated by reference herein.

Figure 2B:
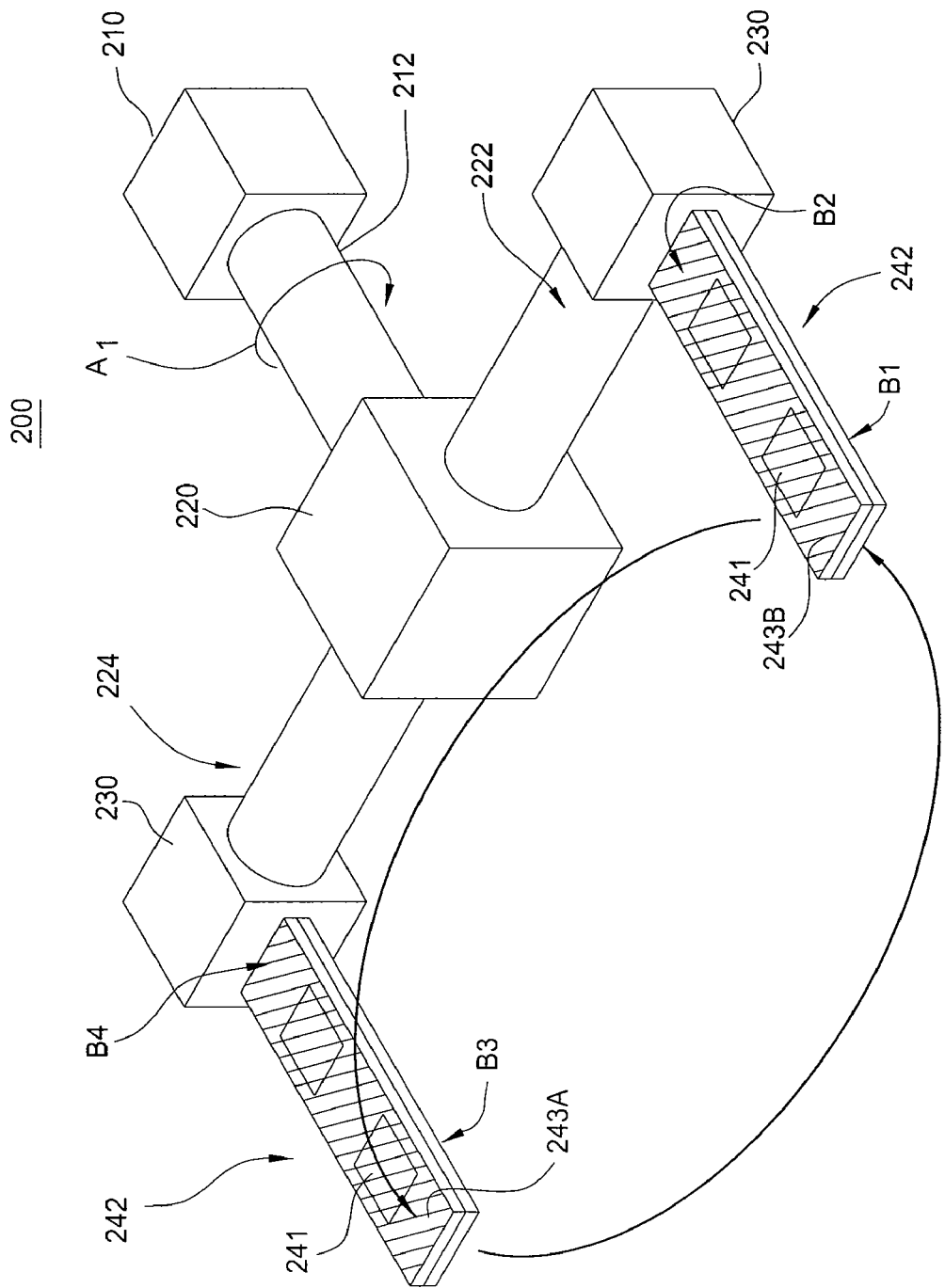
Figure 2C:
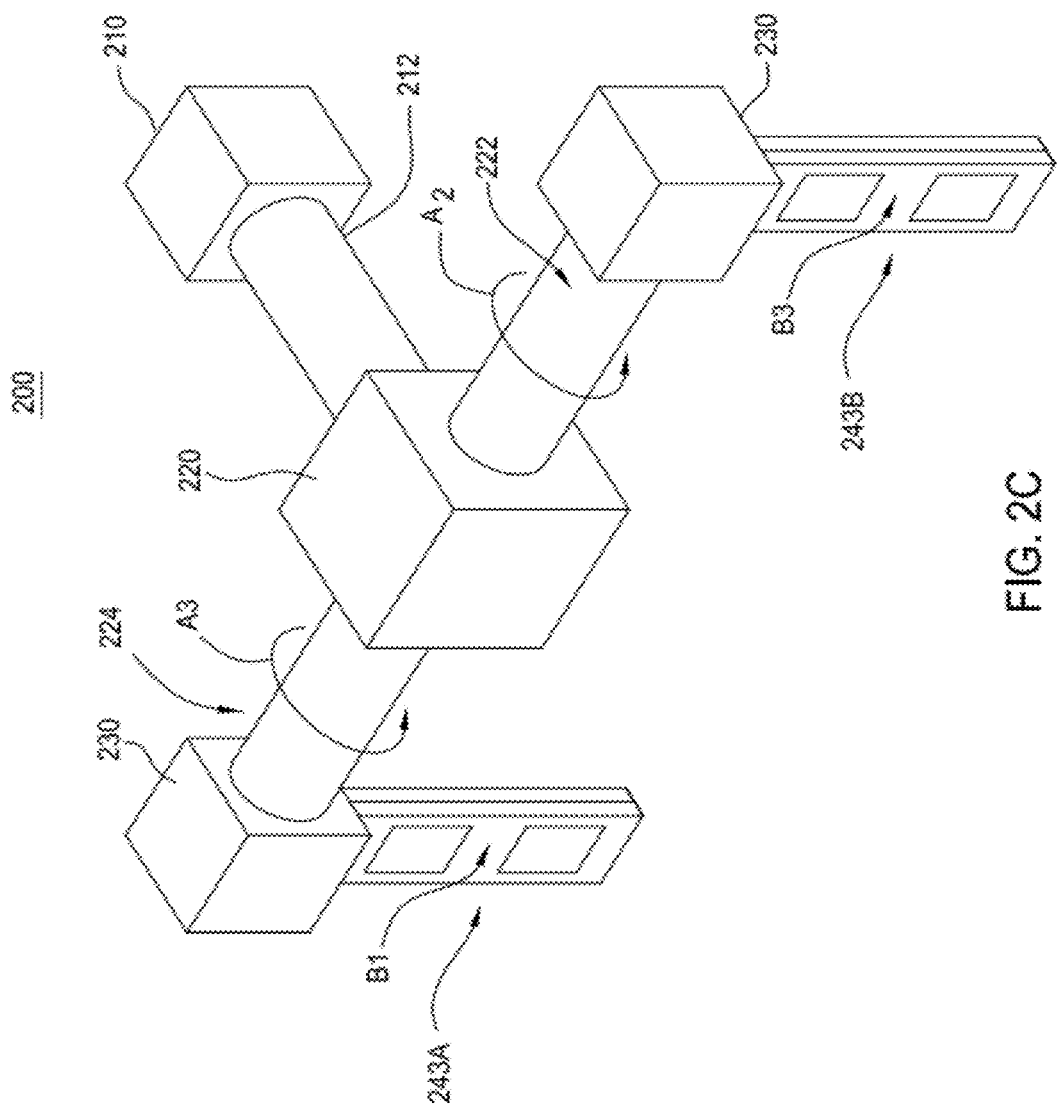
Figure 2D:
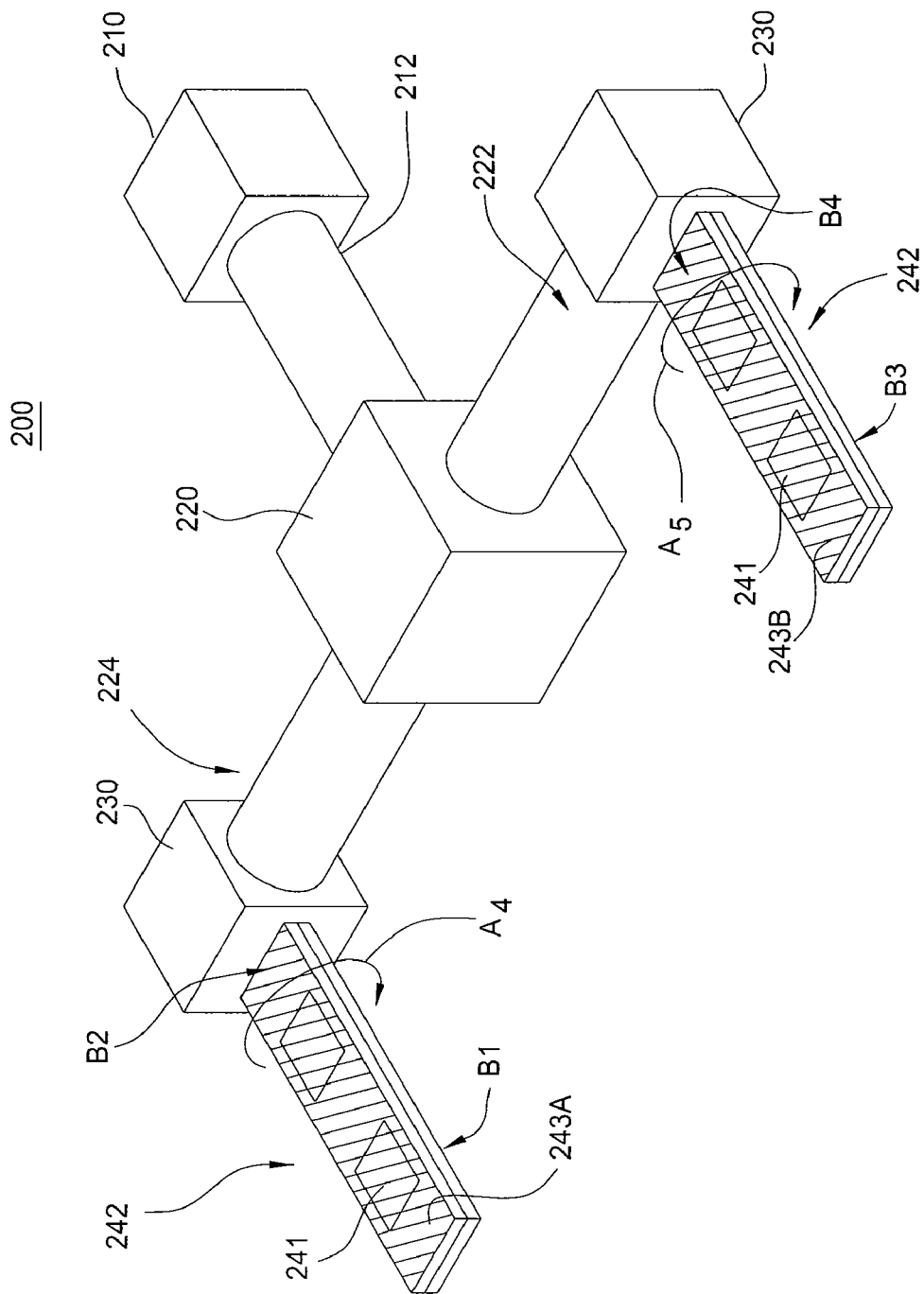
Figure 2E:
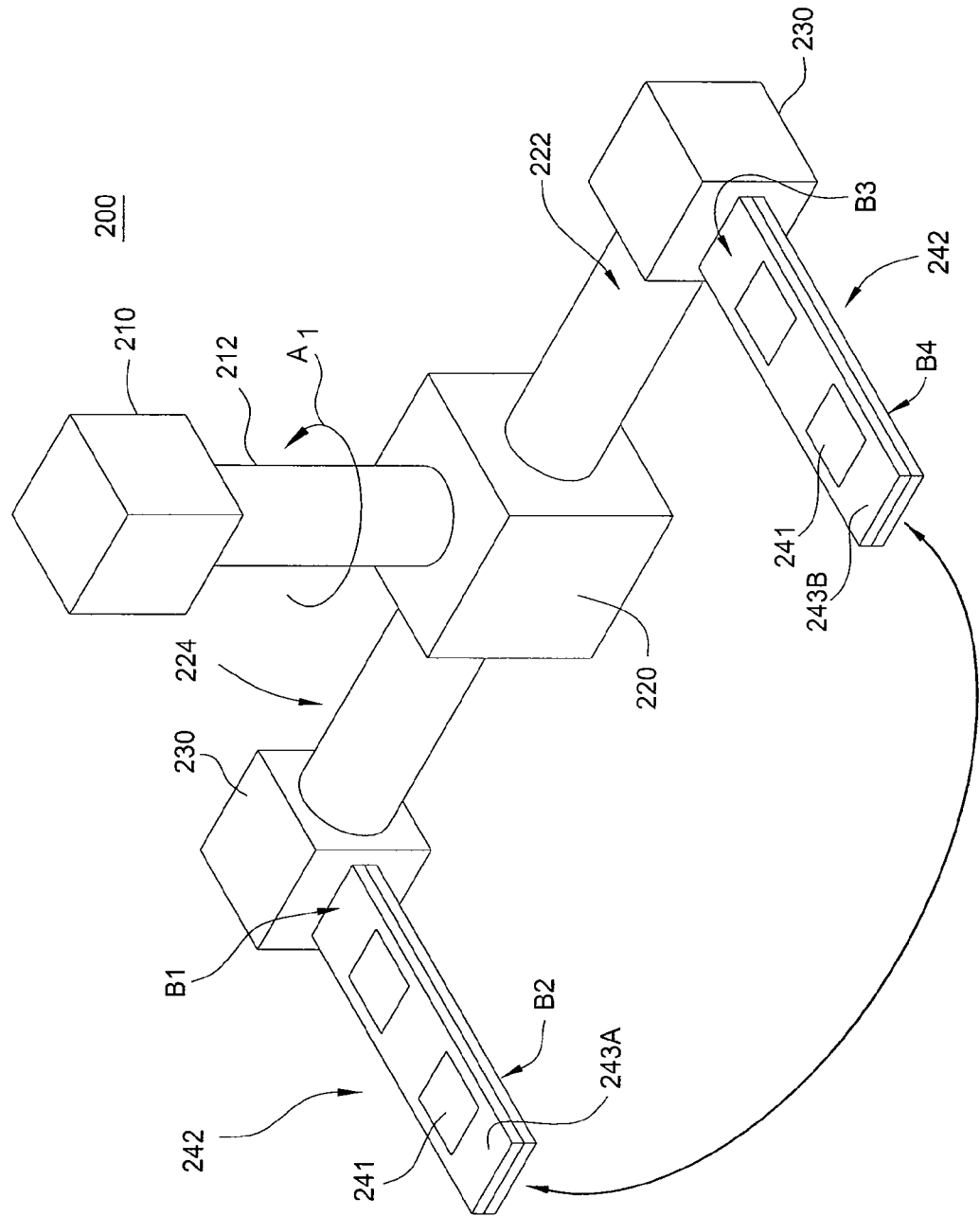

The second base member 220 may be rotated about the axis of the effector arm 212 in either direction (e.g. rotational direction A1) in relation to the first base member 210 (FIG. 2B). Each arm member 230 may be rotated about the axis of the lateral effector arms 222, 224 in either direction (e.g., rotational directions A2 and A3) in relation to the second base member 220. The lateral effector arms 222, and 224 may be rotated about the rotational directions A2 and A3 to position the blades 243 downward as shown in FIG. 2C. The blades 243A, or 243B may be rotated about the axis of the blades (e.g., rotational direction A4 or A5) in relation to either arm member 230, such that substrate supporting sides B2 and B4 are facing upwards as shown in FIG. 2D. In one embodiment, as shown in FIG. 2E, the blades 243A,243B, the second base member 220, and the arm members 230 may be rotated in a horizontal plane about a vertically oriented axis, which extends through the vertically oriented effector arm 212 (e.g., rotational direction A1), by use of an actuator contained in the first base member 210.

Figure 2F:
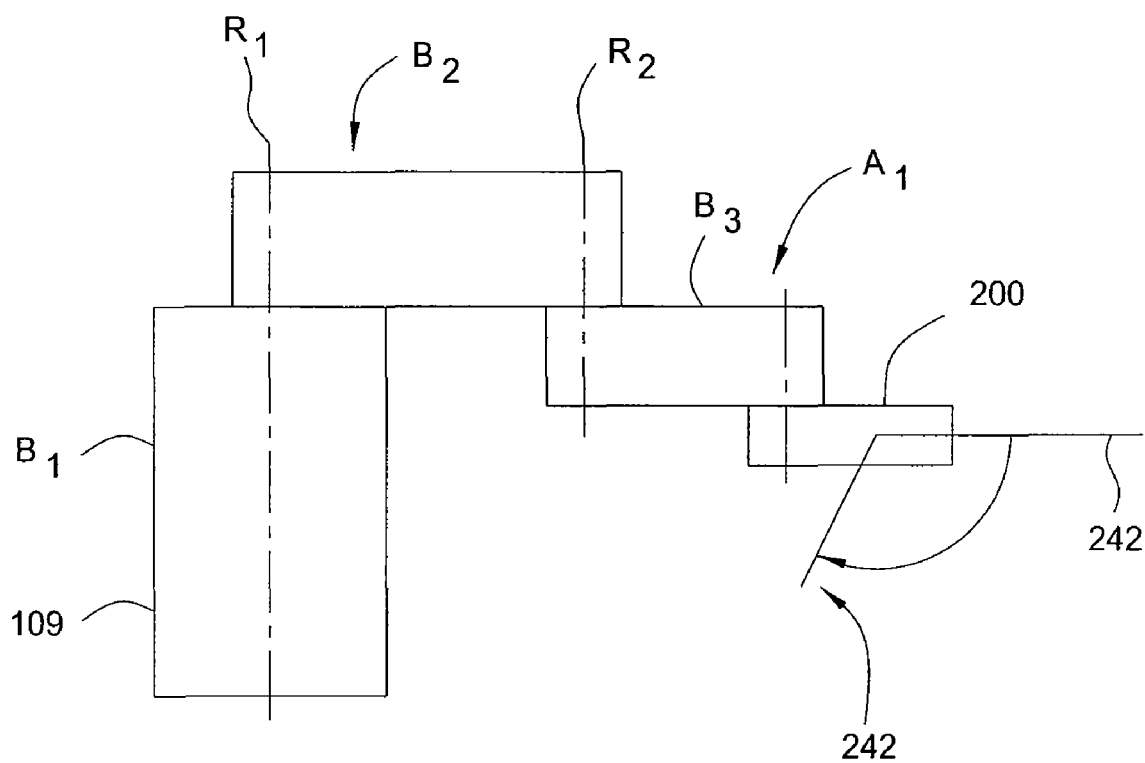

FIG. 2F is a side view of a robot assembly 108 that has an end effector 200 mounted on a SCARA robot 109. The SCARA robot 109 may have a base $B_1$, a first linkage arm $B_2$, and a second linkage arm $B_3$, which are connected to the end effector 200. In general, the first linkage arm $B_2$ may be rotated in relation to the base $B_1$, about a rotational axis $R_1$, by use of a conventional rotational actuator. The second linkage arm $B_3$ may be rotated in relation to the first linkage arm $B_2$, about a rotational axis $R_2$. The blades 243A,243B, the second base member 220, and the arm members 230 in the end effector 200 may be rotated in relation to the second linkage arm $B_3$, about the rotational axis A1 (FIG. 2E). Furthermore, the blade assemblies 242 may be rotated in relation to components in the end effector 200 using one or more actuators connected to the axes A2 and A3 (FIGS. 2A and 2C).

Embodiments of the end effector 200 are not to be limited to those shown in FIG. 2A. Some embodiments of the invention may have one or more blades per lateral effector arm 222, 224 or may have one, two or more arm members 230 extending from the lateral effector arms 222, 224 to be movably attached to these one or more blades. Some embodiments may have each of the five rotational directions A1, A2, A3, A4 and A5 that can be moved independently from each other. In one embodiment, rotational directions A2 and A3 are controlled by a single axis of rotation by the second base member 220. Other embodiments may have only one blade 243, or only one blade supporting side $B_1$, $B_2$, $B_3$ or $B_4$ per blade 243. Embodiments in which only one blade is used, may generally include the case where a single blade is connected to the second base member 220 through the lateral effector arm 222, 224. The embodiments illustrated in FIGS. 1-9 are not intended to limit the scope the invention described herein, since one skilled in the art would appreciate that other combinations and permutations of the rotational axes and blade configurations are possible.

Novel CMP Transferring Sequence

Figure 3:
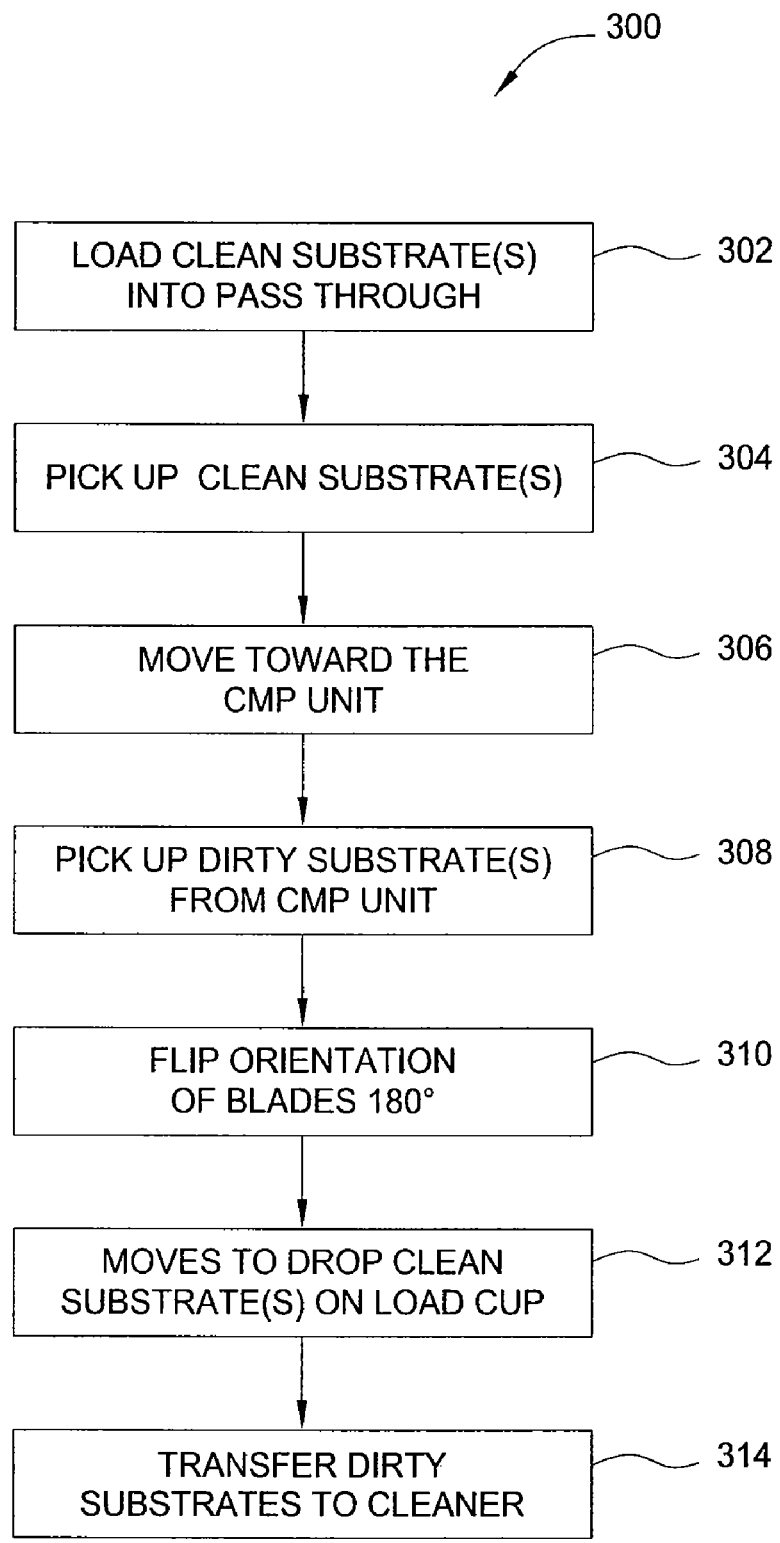
FIG. 3 is a flow diagram illustrating example operations for performing CMP type operations using a dual twin blade end effector according to an embodiment of the present invention.

FIG. 3 illustrates a typical transferring sequence 300 for transferring a substrate in a cluster tool, such as a CMP cluster tool, according to a twin stacked blade embodiment of the present invention. FIGS. 4A-4G illustrate the position of an end effector 200 at various phases of the transferring sequence 300 illustrated in FIG. 3. FIGS. 4A-4G illustrate a dual twin blade configuration in which a pair (i.e., "twin") of dual blades (e.g., two substrate receiving surface) are each adapted to accept one or more substrates. FIGS. 4A1-4G1 are side views of one of the blades assemblies 242 that illustrate the position of the substrates disposed thereon during each of the steps of the transferring sequence 300 shown in FIGS. 4A-4G, respectively. The transferring sequence 300 described herein is not intended to limit the scope the invention, since one skilled in the art would appreciate that the order and/or any number of combinations of movements are possible without deviating from the basic scope of the invention in which an end effector assembly 200 is adapted to transfer and rotationally orient two or more substrates within a cluster tool. The processing sequence discussed herein begins during the steady state operation of the cluster tool, and thus the initial loading of each station in the processing sequence has already been completed. Therefore, in the beginning of the exemplary processing sequence the dirty substrates 1 are positioned in the load cups 110, awaiting to be transported to the cleaner 114, and the clean substrates 2 are positioned in the cassette positions 102 awaiting to be transferred to the pass through positions 106. (FIGS. 1 and 4A). At step 302, substrates are loaded in pass throughs 106 using the FI robot 103 contained in the factory interface 104. In some embodiments, the dirty substrates 1 may be polished in the CMP tool 116 while the clean substrates 2 are loaded into the pass through positions 106. In other embodiments, the CMP tool 116 may have completed polishing before the clean substrates 2 are loaded.

At step 304, the robot arm 109 moves the end effector 200 to the pass through positions 106 to pick up one or more clean substrates 2. In one embodiment, the end effector 200 may be moved through a rotational axis of the robot arm 109 which is connected to the first base member 210. As shown in FIG. 4B, the clean substrates 2 may be picked up by the supporting sides B1 and B3 of the blades 243A and 243B, respectively, so that the device side of the substrates is oriented up. The substrates may be supported on the supporting sides B1 and B3 via any suitable means, such as vacuum chucking region (s) of the blade or an edge gripping device.

At step 306, the robot arm 109, then moves the end effector 200 carrying the clean substrates to the load cups 110 in the CMP unit 116, as shown in FIG. 4C. This movement may be accomplished by cooperative motion between the end effector 200 and the robot arm 109, by horizontal rotation and/or movement, vertical rotation and/or movement, or by a combination of the two.

At step 308, the robot assembly 108 the picks up the dirty substrates, which have already been polished, from the load cups 110 of the CMP unit 116. As shown in FIG. 4D, the face down dirty substrates 1 are then picked up from the load cups 110 by the supporting sides B2 and B4. In this case, the face-up oriented clean substrates 2 received from the pass through positions 106 and the face down oriented dirty substrates 1 received from the load cups 110 are on either side of the blades 243A, 243B.

At step 310, the end effector 200 and/or robot arm 109 then reorients the blades 243 so that the substrates are flipped over, as shown in FIG. 4E. In some embodiments the reorientation of the blades 243 will require a rotation of the substrates by approximately 180 degrees. To accomplish this rotation, the blades 243A and 243B may be rotated by use of axes A4, A5 using a rotational actuator contained in the arm member 230 (FIG. 2D). In another embodiment, the second base member 220 is flipped 180 degrees by use of a rotational actuator contained in the first base member 210 (see FIG. 2B). In yet another embodiment, the blade pairs 243A, 243B may be flipped by rotating the arm members 230 about the axes of the lateral effector arms 222, 224 using a rotational actuator contained in the second base member 220 (See FIG. 2C).

At step 312, the clean substrates are positioned by the end effector 200 and/or robot arm 109 in the load cup 110, as shown in FIG. 4F. In this step, the end effector 200 places the clean substrates 2 in the load cups 110 for polishing and releases the substrates from the supporting surfaces B1 and B3 by releasing the suction in the vacuum chucking components, or releasing the gripping components in the gripping mechanism, attached to the blades 243A or 243B.

At step 314, the dirty substrates are positioned by the end effector 200 and/or robot arm 109 within the cleaner 114, as shown in FIG. 4G. This step may require the orientation of the blades 243 to be rotated 180 degrees (e.g., illustrated in FIG. 2B or 2D) and their vertical orientation to be adjusted by use of an actuator contained in the second base member 220 (e.g., illustrated in FIG. 2C). The orientation of the cleaner 114 illustrated in FIG. 4G is not intended to limiting as to the scope of the invention, since it could also be oriented in a horizontal orientation without varying from the basic scope of the invention disclosed herein.

One will note that other embodiments of the transferring sequence may include other combinations of movement in the rotational directions A1-A5 in order to achieve the picking-up and placement of the clean and dirty substrates as described in FIGS. 2B-2D and FIGS. 4A-4G. For example, instead of the lateral effector arms 222, 224 rotating about axis A2, the blades may rotate about axes A4 and A5 resulting in the equivalent orientation of the substrates.

Single Blade Robot Configuration

Figure 5:
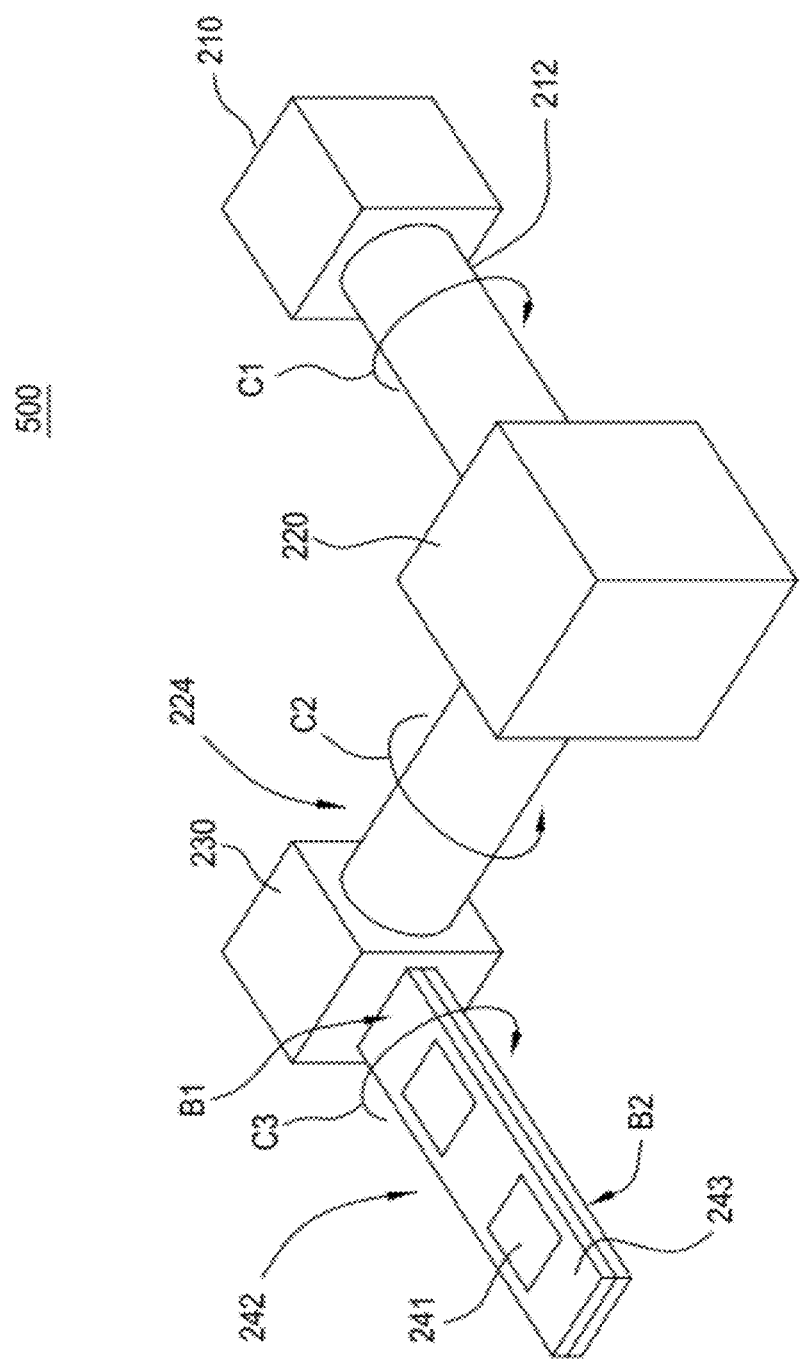
FIG. 5 is an isometric view of an end effector according to an embodiment of the invention.
Figure 6:
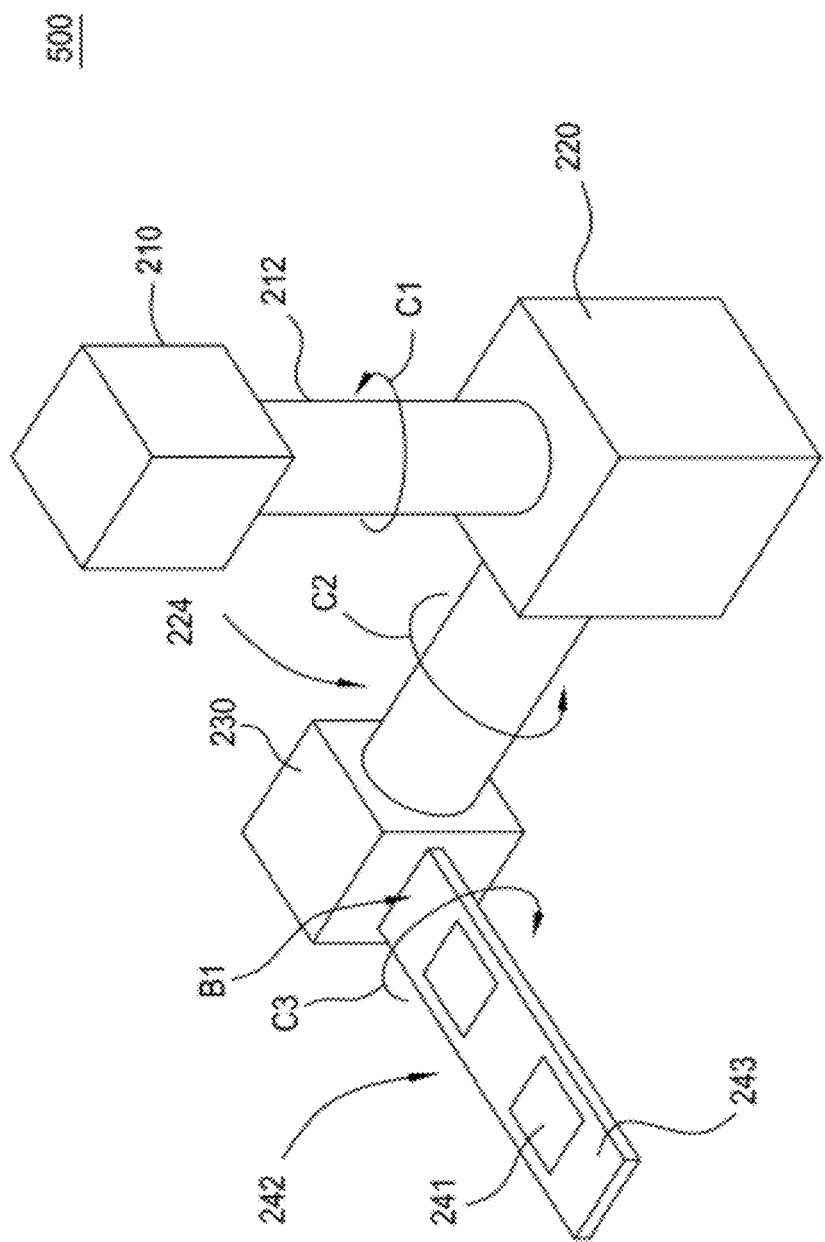
FIG. 6 is an isometric view of the end effector of FIG. 5.

The example operations according to the embodiment of FIG. 3 may also describe the operation of a single stacked blades (e.g., dual blades) end effector that is used to transfer multiple substrates at one time. FIGS. 5 and 6 illustrate an end effector 500 according to one embodiment of the present invention. In one embodiment, the end effector 500 may be movably connected to a robot arm 109 that is part of a cluster tool such as the robot assembly 108 of FIG. 1. In one embodiment, a first base member 210 in the end effector 500 is connected to the last link or arm contained in the robot arm 109 (e.g., a conventional SCARA robot, 6-axis robotic device, or similar robotic device) so that the end effector 500 can be positioned in X, Y and/or Z directions by commands sent to the robot arm 109 by a computer or a controller. The end effector 500 may be used to position substrates in and transfer substrates between various chambers in a CMP transferring process.

In one embodiment, the end effector 500 may be connected to a robot arm 109 (FIG. 1) through a first base member 210, which is connected to a second base member 220 through an effector arm 212. The second base member 220 may be movably connected to one or more arm members 230 through a lateral effector arm 224. In one embodiment, the second base member 220 may be rotated about the axis of the effector arm 212 in either direction (e.g. rotational direction C1) in relation to the first base member 210.

Arm member 230 may be movably connected to one or more blades 243 found in the blade assembly 242. In one embodiment, the blade 243 has two substrate supporting surfaces B1 and B2. One will note that the arm member 230 may be rotated about the axis of the lateral effector arm 224 in either direction (e.g., rotational direction C2) in relation to the second base member 220. In one embodiment, the blades 243A, 243B may be rotated about the axis of the blades (e.g., rotational direction C3) in relation to the arm member 230.

In some embodiments, the blade(s) 243 may have a sensor 241 that is used to detect the position of the substrate with respect to the blade. The blade(s) may comprise any various means to couple with the substrate, such as a vacuum chucking components or edge gripping components. An example of an exemplary robot blade and gripping member is further described in the commonly assigned U.S. patent application Ser. No. 11/315,873, filed Dec. 22, 2007, which is incorporated by reference herein.

Embodiments of the end effector 500 are not to be limited to those shown in FIGS. 5 and 6. Other embodiments of the invention may have two or more blades 243 per lateral effector arm 224. In another embodiment, the lateral effector arm 224 has two or more arm members 230 to movably position the blade(s) attached to each arm member 230. In some embodiments, the rotational directions C1, C2, and C3 are adapted to move independently from each other. Other embodiments may have the lateral effector arm 224 extendable from the second base member 220 to which it connects. Other embodiments may have only one blade 243, or only one blade coupled to an arm member 230. For embodiments with only one blade, there may most likely not be lateral effector arm 224 or an arm member 230, but instead the single blade would be connected to the second base member 220 (FIG. 6). In one embodiment, as shown in FIG. 6, the blade 243, the second base member 220, and the arm member 230 may be rotated in a horizontal plane about a vertically oriented axis, which extends through the vertically oriented effector arm 212 (e.g., rotational direction A1), by use of an actuator contained in the first base member 210.

Single Blade Transfer Sequence

The processing sequence discussed herein begins during the steady state operation of the cluster tool, and thus the initial loading of the each station in the processing sequence has already been completed. Therefore, in the beginning of the exemplary processing sequence the dirty substrates 1 are positioned in the load cups 110, awaiting to be transported to the cleaner 114, and the clean substrates 2 are positioned in the cassette positions 102 awaiting to be transferred to the pass through positions 106 (FIG. 1).

Figure 7A:
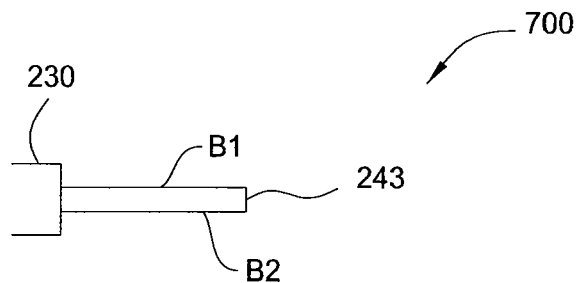
FIGS. 7A-7F are side views of the end effector according to embodiments of the invention.

Next, the end effector 500 is moved to the pass through position 106. The end effector 500 may be moved through a rotational axis of the robot arm 109 which may be connected to a second base member 210, for example. FIGS. 7A-7F illustrate the position of one or more substrates on a blade 243 contained in the stacked blade end effector 500 at each step during the transferring sequence FIG. 7A illustrates a profile view of a blade 243 prior to the receiving a substrate. As noted above and discussed herein, in some embodiments, there may be only one blade per effector. In some embodiments, the dirty substrate 1 may be polished in the CMP tool 116 while the clean substrate 2 is loaded into the pass through position 106. In other embodiments, the CMP tool 116 may have completed polishing before the clean substrate 2 is loaded into the pass through position 106.

Figure 7B:
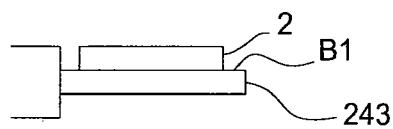

The clean substrate 2 may be picked up by the supporting surface B1 of blades 243 so that the device side of the substrate is facing up. Receiving the substrate on the supporting surface B1 may occur via any suitable means, such as suction or an edge gripping devices. FIG. 7B illustrates a profile view of the blade 243 with the clean substrate 2 positioned on the supporting surface B1.

The clean substrate 2 coupled to the end effector 500 is then moved to the load cup 110. The clean substrate 2 will remain on blade 243 while the end effector 500 is moved to the load cup 110.

Figure 7C:
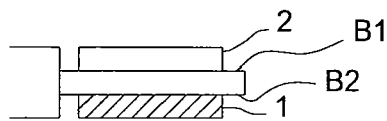

A face down dirty substrate 1 is picked up by the supporting surface B2. As shown in FIG. 7C, a clean substrate 2 and a dirty substrate 1 are positioned on either side of the single stacked blade 243. In this case, the dirty substrate 1 is positioned on supporting surface B2 and the clean substrate 2 is placed on supporting surface B1.

Figure 7D:
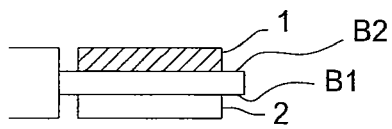
Figure 7E:
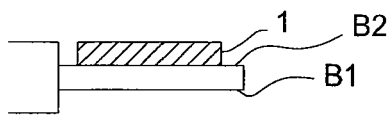

The effector arm may be rotated (e.g., 180 degrees), and the dirty substrate 1 is positioned with the device side up and the clean substrate 2 is positioned with the device side down. In this case, the dirty substrate 1 is flipped so that it is facing upwards, while the clean substrate 2 is flipped so that it is facing downwards, as shown in FIG. 7D. In some embodiments, the blade 243 may be rotated in direction C1 in an effort to flip the dirty substrate 1 on top and the clean substrate 2 on the bottom. The end effector may then place the clean substrate 2 on the load cup 110 for polishing. In another embodiment, the blade 243 may be rotated in direction C3 using an actuator in the arm member 230 so that the dirty substrate 1 is face-up and the clean substrate 2 is face-down.

Next, the clean substrate is positioned by the end effector 500 and/or robot arm 109 in the load cup 110. In this step, the end effector 500 places the clean substrates 2 in the load cups 110 for polishing and releases the substrates from the supporting surface B1 by releasing suction or releasing the gripping mechanism attached to the blades 243.

Figure 7F:
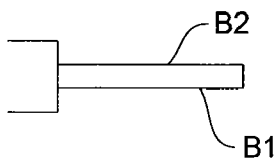

After the clean substrate 2 is placed in the load cup 110, the end effector 500 is then moved to the cleaner 114, and the dirty substrate 1 may be dropped into a cleaning area. FIG. 7F illustrates a profile view of the blades after the dirty substrate has been deposited in the cleaner 114.

Some embodiments may include any combination of movement in the rotational direction C1 in order to achieve the picking and placing of the clean and dirty substrate.

In one embodiment of the end effector 500, two dirty substrates 1, or two clean substrates 2, may be transferred at a time between various stations within the cluster tool on the opposing sides of the blade 243 (i.e., supporting surface B1, B2). For example, the end effector 500 may pickup a dirty substrate 1 on each of the supporting surfaces B1, B2 from both of the load cups 110 and then transfer and separately drop-off the dirty substrates 1 in two positions in the cleaner 114. Then the end effector 500 may pickup a clean substrate 2 on the supporting surfaces B1, B2 from both of the pass throughs 106 and then transfer and separately drop-off the clean substrates 2 in each of the two load cup 110 positions.

Dual Twin Blade Transfer Sequence

Figure 8:
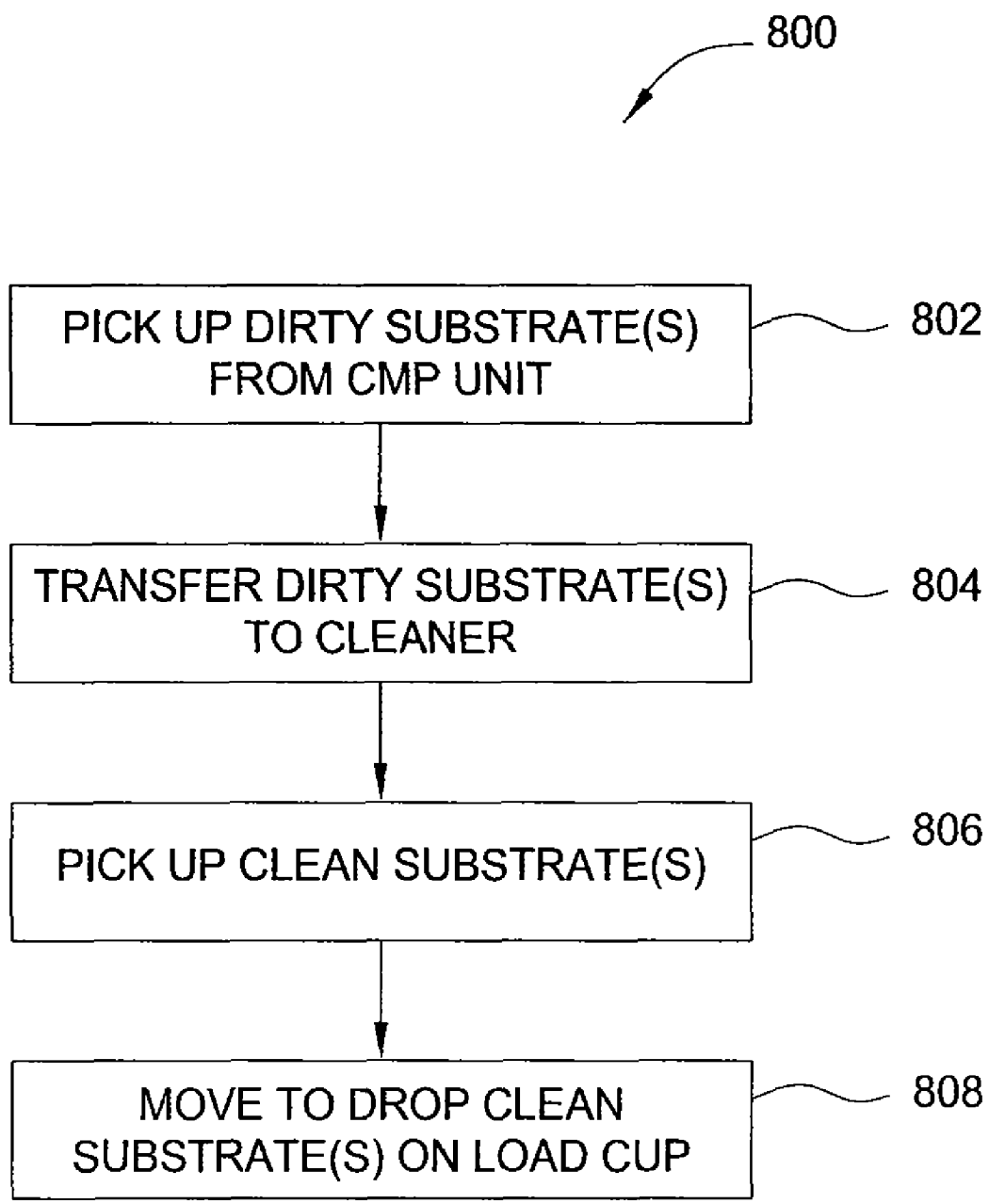
FIG. 8 is a flow diagram illustrating an exemplary transferring sequence that can be performed in a cluster tool.

FIG. 8 illustrates a typical transferring sequence 800 for transferring two substrates in a cluster tool, such as a CMP cluster tool, according to a twin blade embodiment of the present invention. FIGS. 9A-9F illustrate the position of an end effector 200 at various phases of the transferring sequence 800 illustrated in FIG. 8. FIGS. 9A-9F illustrate a single twin blade configuration in which a pair (i.e., "twin") of single blades (e.g., one substrate receiving surface) are each adapted to accept a substrate. FIGS. 9A1-9F1 are side views of a blade 243 that illustrate the position of the substrates disposed thereon during each of the steps of the transferring sequence 800 shown in FIGS. 9A-9F, respectively. The transferring sequence 800 described herein is not intended to limit the scope the invention, since one skilled in the art would appreciate that the order and/or any number of combinations of movements are possible without deviating from the basic scope of the invention in which an end effector assembly 200 is adapted to transfer and rotationally orient a pair of substrates within a cluster tool. The processing sequence discussed herein begins during the steady state operation of the cluster tool, and thus the initial loading of each station in the processing sequence has already been completed. Therefore, in the beginning of the exemplary processing sequence the dirty substrates 1 are positioned in the load cups 110, awaiting to be transported to the cleaner 114, and the clean substrates 2 are positioned in the cassette positions 102 awaiting to be transferred to the pass through positions 106. (FIGS. 1 and 9A). Prior to step 802, substrates are loaded in pass throughs 106 using the FI robot 103 contained in the factory interface 104. In some embodiments, the dirty substrates 1 may be polished in the CMP tool 116 while the clean substrates 2 are loaded into the pass through positions 106. In other embodiments, the CMP tool 116 may have completed polishing before the clean substrates 2 are loaded.

At step 802, the robot arm 109 moves the end effector 200 to the load cups 110 to pick up two dirty substrates 1 (FIG. 9B). In FIG. 9B, the dirty substrates 1 may be picked up by the supporting surface of the blades 243 so that the device side is facing down. Receiving the substrate on the supporting surface may occur through any means previously discussed. In one embodiment of step 802, the end effector 200 may be moved through a rotational axis of the robot arm 109 which is connected to the first base member 210. As shown in FIG. 9B, the dirty substrates 1 are picked up by the supporting sides of the blades 243, so that the device side of the substrates is still oriented down. The substrates may be supported via any suitable means, such as vacuum chucking region(s) of the blade or an edge gripping device.

At step 804, the robot arm 109, then moves the end effector 200 carrying the dirty substrates to the cleaner 114, as shown in FIG. 9C. This movement may be accomplished by cooperative motion between the end effector 200 and the robot arm 109, by horizontal rotation and/or movement, vertical rotation and/or movement, or by a combination of the two.

At step 806, the robot arm 109 moves the end effector 200 to the pass through positions 106 to pick up clean substrates 2 on each blade 243. In one embodiment, the end effector 200 may be moved through a rotational axis of the robot arm 109 which is connected to the first base member 210. As shown in FIG. 9D, the clean substrates 2 may be picked up by the supporting surface of the blades 243, so that the device side of the substrates is oriented up. The substrates may be supported on the blades 243 via any suitable means, such as vacuum chucking region(s) of the blade or an edge gripping device.

At step 808, the end effector 200 and/or robot arm 109 then reorients the blades 243 so that the clean substrates 2 are flipped over, as shown in FIG. 9E, and the clean substrates 2 are positioned by the end effector 200 and/or robot arm 109 in the load cup 110, as shown in FIG. 9F. In some embodiments the reorientation of the blades 243 will require a rotation of the substrates by approximately 180 degrees. To accomplish this rotation, the blades 243 may be rotated by use of axes A4, A5 (FIG. 2A) using a rotational actuator contained in the arm member 230. In another embodiment, the second base member 220 is flipped 180 degrees by use of a rotational actuator contained in the first base member 210 (FIG. 2B). In yet another embodiment, the blades 243 may be flipped by rotating the arm members 230 about the axes of the lateral effector arms 222, 224 using a rotational actuator contained in the second base member 220 (FIG. 2C).

One will note that other embodiments of the transferring sequence 800 may include other combinations of movement in the rotational directions A1-A5 in order to achieve the picking and placing of the clean and dirty substrates as described in FIGS. 2B-2D and FIGS. 9A-9F. For example, instead of the lateral effector arms 222, 224 rotating about axis A2, the blades may rotate about axes A4 and A5 resulting in the equivalent orientation of the substrates.

While the foregoing is directed to embodiments of the present invention, other and further embodiments of the invention may be devised without departing from the basic scope thereof, and the scope thereof is determined by the claims that follow.

What is claimed is:

1. An end effector for transferring a substrate in a processing system, the end effector comprising:
a first base member;
a second base member rotationally coupled to the first base member by an effector arm;
at least one arm member rotationally coupled to the second base member by at least one lateral effector arm, wherein:
the at least one arm member comprises first and second arm members; the
at least one lateral effector arm comprises first and second lateral effector arms;
the first arm member is rotationally coupled to the second base member by the first lateral effector arm;
the second arm member is rotationally coupled to the second base member by the second lateral effector arm; and
at least one blade assembly rotationally coupled to the at least one arm member, the blade assembly comprising at least two substrate supporting surfaces disposed on opposite sides of the blade assembly and positioned to retain at least two substrates simultaneously on the blade assembly, wherein the at least two substrate supporting surfaces each include a sensor for detecting a position of its at least two substrates relative to the respective substrate supporting surface and wherein the at least one blade assembly comprises a first blade assembly rotationally coupled to the first arm member and a second blade assembly rotationally coupled to the second arm member.

2. A substrate processing system comprising:
at least one substrate position for holding substrates;
at least one load cup for temporarily storing substrates; and
a robot assembly positioned to transfer substrates between the at least one substrate position and the at least one load cup, the robot assembly comprising an end effector moveably connected to a robot arm, the end effector comprising:
a first base member;
a second base member rotationally coupled to the first base member by an effector arm;
at least one arm member rotationally coupled to the second base member by at least one lateral effector arm, wherein:
the at least one arm member comprises first and second arm members;
the at least one lateral effector arm comprises first and second lateral effector arms;
the first arm member is rotationally coupled to the second base member by the first lateral effector arm;
the second arm member is rotationally coupled to the second base member by the second lateral effector arm; and
at least one blade assembly rotationally coupled to the at least one arm member, the blade assembly comprising at least a first substrate supporting surface and a second substrate supporting surface on opposite sides of the blade assembly, wherein the first and second substrate supporting surfaces are positioned to retain at least two substrates simultaneously on the blade assembly, and wherein the first and second substrate supporting surfaces each include a sensor for detecting a position of its at least two substrates relative to the respective substrate supporting surface and wherein the at least one blade assembly comprises a first blade assembly rotationally coupled to the first arm member and a second blade assembly rotationally coupled to the second arm member.

3. The system of claim 2, wherein the robot assembly is positioned to pick up a first substrate from the at least one substrate position using the first substrate supporting surface and to pick up a second substrate from the at least one load cup using the second substrate supporting surface while the first substrate is supported on the first substrate supporting surface.

4. A method of transferring substrates in a substrate processing system, the method comprising:
positioning a blade assembly of an end effector adjacent to a substrate position of a substrate processing system, wherein the end effector is moveably connected to a robot arm of a robot assembly and comprises:
a first base member;
a second base member rotationally coupled to the first base member by an effector arm;
at least one arm member rotationally coupled to the second base member by at least one lateral effector arm, wherein:
the at least one arm member comprises first and second arm members;
the at least one lateral effector arm comprises first and second lateral effector arms;
the first arm member is rotationally coupled to the second base member by the first lateral effector arm;
the second arm member is rotationally coupled to the second base member by the second lateral effector arm, wherein the blade assembly is rotationally coupled to the end effector and has a first substrate supporting surface and a second substrate supporting surface on opposite sides of the blade assembly, wherein the at least one blade assembly comprises a first blade assembly rotationally coupled to the first arm member and a second blade assembly rotationally coupled to the second arm member and wherein the first and second substrate supporting surfaces each include a sensor for detecting a position of a substrate relative to its respective substrate supporting surface;
picking up a first substrate from the substrate position using the first substrate supporting surface;
positioning the blade assembly adjacent a load cup of the substrate processing system; and
picking up a second substrate from the load cup using the second substrate supporting surface while the first substrate is supported on the first substrate supporting surface.

5. The method of claim 4, further comprising:
rotating the blade assembly about a first axis; and
dropping the first substrate onto the load cup from the first substrate supporting surface while the second substrate is supported on the second substrate supporting surface.

6. The method of claim 5, further comprising:
rotating the blade assembly about a second axis; and
positioning the second substrate within a cleaner of the substrate processing system.

7. The end effector of claim 1, wherein the effector arm is rotatable about a first axis, wherein the at least one lateral effector arm is rotatable about a second axis, wherein the at least one blade assembly is rotatable about a third axis, wherein the second axis is perpendicular to the first axis, and wherein the third axis is perpendicular to the second axis.

8. The end effector of claim 7, wherein the first and second lateral effector arms are rotatable about the second axis, and wherein the first blade assembly is rotatable about the third axis and the second blade assembly is rotatable about a fourth axis parallel to the third axis.

9. The substrate processing system of claim 2, wherein the effector arm is rotatable about a first axis, wherein the at least one lateral effector arm is rotatable about a second axis, wherein the at least one blade assembly is rotatable about a third axis, wherein the second axis is perpendicular to the first axis, and wherein the third axis is perpendicular to the second axis.

10. The substrate processing system of claim 9, wherein the first and second lateral effector arms are rotatable about the second axis, and wherein the first blade assembly is rotatable about the third axis and the second blade assembly is rotatable about a fourth axis parallel to the third axis.

* * * * *